(12) United States Patent
He

(10) Patent No.: US 12,196,994 B2
(45) Date of Patent: Jan. 14, 2025

(54) DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Chunmei He, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 1099 days.

(21) Appl. No.: 16/759,647

(22) PCT Filed: Mar. 17, 2020

(86) PCT No.: PCT/CN2020/079708
§ 371 (c)(1),
(2) Date: Apr. 27, 2020

(87) PCT Pub. No.: WO2021/168929
PCT Pub. Date: Sep. 2, 2021

(65) Prior Publication Data
US 2023/0092654 A1 Mar. 23, 2023

(30) Foreign Application Priority Data
Feb. 25, 2020 (CN) .......................... 202010116769.5

(51) Int. Cl.
*G02B 5/30* (2006.01)
*G02B 1/14* (2015.01)

(52) U.S. Cl.
CPC ............. *G02B 5/3083* (2013.01); *G02B 1/14* (2015.01); *G02B 5/3016* (2013.01)

(58) Field of Classification Search
CPC ....... G02B 5/3083; G02B 1/14; G02B 5/3016
See application file for complete search history.

(56) References Cited

U.S. PATENT DOCUMENTS

2013/0140587 A1* 6/2013 Lim ..................... G02B 5/3083
427/163.1
2013/0329288 A1* 12/2013 Yim ....................... H10K 50/86
359/483.01
(Continued)

FOREIGN PATENT DOCUMENTS

CN 105334994 A 2/2016
CN 107845665 A 3/2018
(Continued)

OTHER PUBLICATIONS

International Search Report in International application No. PCT/CN2020/079708, mailed on Nov. 25, 2020.
(Continued)

*Primary Examiner* — Nathan W Ha
(74) *Attorney, Agent, or Firm* — PV IP PC; Wei Te Chung

(57) ABSTRACT

The present invention relates to a display device. On the one hand, a first glass is provided between the cover plate and the polarizer, and the high yield strength characteristic of the first glass is used to effectively improve the problem of bending creases caused by bending multiple times, wherein the rigidity of the first glass is used to improve the flatness of the display device. On the other hand, the second glass is used instead of the PI substrate in the prior art to further improve the flatness of the display device.

10 Claims, 4 Drawing Sheets

(56) References Cited

U.S. PATENT DOCUMENTS

| | | | |
|---|---|---|---|
| 2015/0378476 A1* | 12/2015 | Sung | G02F 1/13338 |
| | | | 345/174 |
| 2016/0035806 A1* | 2/2016 | Park | H10K 50/8445 |
| | | | 257/40 |
| 2016/0041667 A1 | 2/2016 | Lai et al. | |
| 2016/0259104 A1* | 9/2016 | Lee | G02B 5/3033 |
| 2016/0351856 A1* | 12/2016 | Jung | H01L 27/1255 |
| 2017/0125743 A1* | 5/2017 | Kim | G02B 5/3016 |
| 2017/0153732 A1* | 6/2017 | Choi | G02B 5/3025 |
| 2017/0343713 A1* | 11/2017 | Lee | G02B 5/3083 |
| 2018/0081089 A1* | 3/2018 | Kim | G02B 1/14 |
| 2018/0173028 A1* | 6/2018 | Koppal | G09G 3/3648 |
| 2018/0219181 A1* | 8/2018 | Son | H10K 50/86 |
| 2018/0224340 A1* | 8/2018 | Koppal | G01L 1/205 |
| 2018/0284331 A1* | 10/2018 | Rantala | H10K 59/38 |
| 2018/0299603 A1* | 10/2018 | Lee | G02B 5/3016 |
| 2018/0337219 A1* | 11/2018 | Rhee | G02B 5/3025 |
| 2019/0034690 A1* | 1/2019 | Jung | G06V 40/1318 |
| 2019/0131584 A1 | 5/2019 | Tang | |
| 2019/0369799 A1* | 12/2019 | Jeon | G06F 3/0448 |
| 2019/0391308 A1* | 12/2019 | Nomura | G02B 5/208 |
| 2020/0050360 A1* | 2/2020 | Jeon | G06V 40/1306 |
| 2020/0081162 A1* | 3/2020 | Park | H10K 50/844 |
| 2020/0266352 A1* | 8/2020 | Kubota | H10K 59/124 |
| 2020/0271844 A1* | 8/2020 | Lee | H10K 50/865 |
| 2020/0348453 A1* | 11/2020 | Kim | G02B 5/3033 |
| 2020/0381501 A1* | 12/2020 | Zeng | H10K 59/122 |
| 2021/0181860 A1* | 6/2021 | Ye | G06F 3/0202 |
| 2022/0012452 A1* | 1/2022 | Li | G06F 21/32 |

FOREIGN PATENT DOCUMENTS

| | | |
|---|---|---|
| CN | 109599415 A | 4/2019 |
| CN | 109940948 A | 6/2019 |
| CN | 109946861 A | 6/2019 |
| CN | 110175600 A | 8/2019 |
| CN | 110571251 A | 12/2019 |
| CN | 110635065 A | 12/2019 |
| CN | 111081742 A | 4/2020 |
| CN | 111176490 A | 5/2020 |
| KR | 20120075118 A | 7/2012 |
| KR | 20200001881 A | 1/2020 |

OTHER PUBLICATIONS

Written Opinion of the International Searching Authority in International application No. PCT/CN2020/079708, mailed on Nov. 25, 2020.

Chinese Office Action issued in corresponding Chinese Patent Application No. 202010116769.5 dated Dec. 29, 2020, pp. 1-11.

\* cited by examiner

DISPLAY DEVICE

BACKGROUND OF INVENTION

The present application claims priority to Chinese patent application no. 202010116769.5 submitted to Chinese Patent Office on Feb. 25, 2020, entitled "display device", the entire contents of which are incorporated herein by reference.

FIELD OF INVENTION

The present invention relates to a field of display technology, and in particular, to a display device.

DESCRIPTION OF PRIOR ART

The display device can translate the computer's data into various characters, numbers, symbols or intuitive images for display, and can use an input tool such as a keyboard to input commands or data into the computer, and the display content can be added, deleted, and changed at any time with the help of system hardware and software. Display devices are classified into plasma, liquid crystal, light-emitting diode, and cathode ray tube types according to the display component used.

Organic light-emitting display devices (OLED) are also called organic electroluminescence display devices and organic light-emitting semiconductors. The working principle of an OLED is: when the power is supplied at an appropriate voltage, the anode hole and the cathode charge will be combined in the light-emitting layer, and under the action of Coulomb force, they will be recombined to form an exciton (electron-hole pair) in an excited state at a certain probability. This excited state is unstable in the ordinary environment, wherein excitons in the excited state are recombined to transfer energy to a light-emitting material, so that the energy level transitions from the ground state to the excited state. The excited state energy generates photons through the radiation relaxation process, to release light energy and produce light including three primary colors of red, green, and blue (RGB) according to its formula, forming the basic color.

Today, the OLED has become one of the most important display technologies due to its advantages of low voltage demand, high power saving efficiency, fast response times, light weight, thin thickness, simple structure, low cost, wide viewing angles, almost infinitely high contrast, low power consumption, and extremely high response times, etc.

Folding mobile phones are the future technology development trend. In order to satisfy the folding reliability and the miniaturization of the folding radius, the demand for a folding product is getting higher and higher, and the pursuit of thinning is ever-increasing. However, thinning of the material results in a low surface flatness and creases generated in a bending center. Therefore, there is a need to develop a new display device to solve the above problems.

SUMMARY OF INVENTION

An object of the present invention is to provide a display device capable of solving problems such as low flatness and creases in a bending center present in the existing display devices.

In order to solve the above problems, the present invention provides a display device including a display screen; a polarizer disposed on the display screen; a cover plate disposed on the polarizer; and a first glass disposed between the polarizer and the cover plate.

Further, the display screen includes: a second glass; a buffer layer disposed on the second glass; a thin film transistor layer disposed on the buffer layer; a light-emitting layer disposed on the thin film transistor layer; an encapsulation layer disposed on the light-emitting layer; and a touch sensor layer disposed on the encapsulation layer.

Further, the polarizer includes: a first liquid crystal layer disposed on the display screen; a ¼ wavelength plate disposed on the first liquid crystal layer; an interlayer disposed on the ¼ wavelength plate; and a second liquid crystal layer disposed on the interlayer.

Further, the cover plate includes: an explosion-proof film disposed on the first glass; a hard coat layer disposed on the explosion-proof film; and a protective film disposed on the hard coat layer.

Further, the display device further includes: an optical adhesive disposed between the display screen and the polarizer.

Further, an optical adhesive disposed between the polarizer and the cover plate.

Further, a protective layer disposed between the display screen and the polarizer.

Further, the first glass is made of a material including at least one of inorganic minerals, $Na_2SiO_3$, $CaSiO_3$, $SiO_2$, and $Na_2O \cdot CaO \cdot 6SiO_2$.

Further, the second glass is made of a material including at least one of inorganic minerals, $Na_2SiO_3$, $CaSiO_3$, $SiO_2$, and $Na_2O \cdot CaO \cdot 6SiO_2$.

Further, each of the first glass and the second glass has a thickness less than 100 μm.

The present invention relates to a display device. On the one hand, a first glass is provided between the cover plate and the polarizer, and the high yield strength characteristic of the first glass is used to effectively improve the problem of bending creases caused by bending multiple times, wherein the rigidity of the first glass is used to improve the flatness of the display device. On the other hand, the second glass is used instead of the PI substrate in the prior art to further improve the flatness of the display device.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

Figure 1:
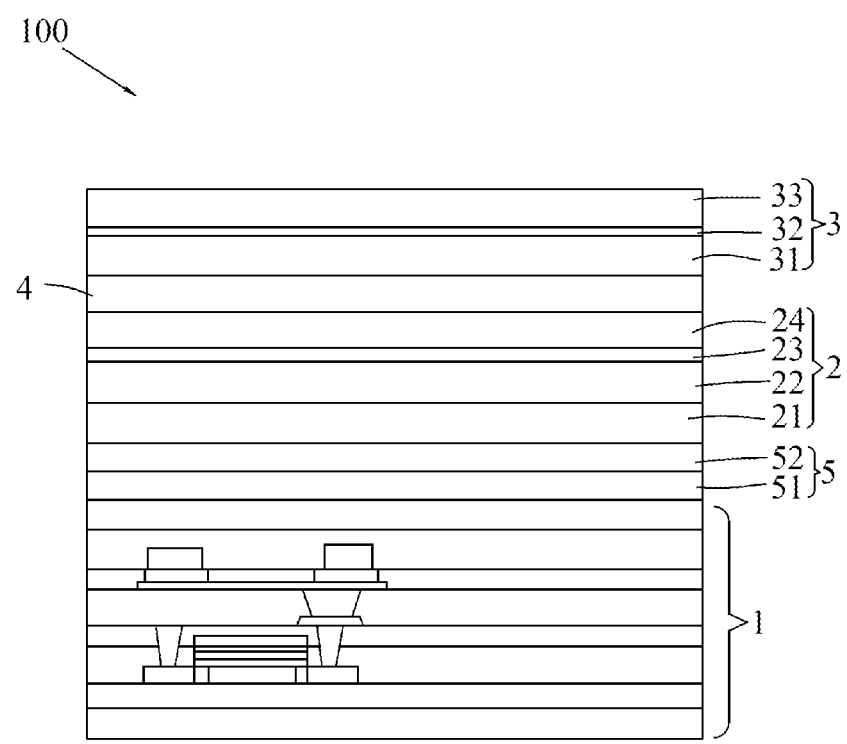
FIG. 1 is a schematic structural diagram of a display device according to the Embodiment 1.

Elements in the drawing are designated by reference numerals listed below.

100. display device; 1. display; 2. polarizer; 3. cover; 4. first glass; 5. optical adhesive; 6. protective layer; 11. second glass; 12. buffer layer; 13. thin film transistor layer; 14. light-emitting layer; 15. encapsulation layer; 16. touch sensor layer; 121, first buffer layer; 122, second buffer layer; 131. active layer; 132. insulating layer; 133. gate layer; 134. interlayer insulation layer; 135. source/drain layer 136. planarization layer; 1311. main body; 1312. side; 1321. first insulating layer; 1322. second insulating layer; 1331. first gate layer; 1332. second gate layer; 141. anode layer; 142. organic light-emitting layer; 143. cathode layer; 21. first liquid crystal layer 22. ¼ wavelength plate; 23. interlayer; 24. second liquid crystal layer; 31. explosion-proof film; 32. hard coat layer; 33. protective film; 51. first optical adhesive; 52. second optical adhesive.

DETAILED DESCRIPTION OF PREFERRED EMBODIMENTS

The preferred embodiments of the present invention are described in detail below with reference to the accompanying drawings, in which FIG. Those skilled in the art will more readily understand how to implement the present invention. The present invention may, however, be embodied in many different forms and embodiments, and the scope of the present invention is not limited to the embodiments described herein.

The following description of the various embodiments is provided to illustrate the specific embodiments of the present invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the figures which are merely references.

In the drawings, the spatially relative terms are intended to encompass different orientations in addition to the orientation as depicted in the figures. Moreover, the size and thickness of each component shown in the drawings are arbitrarily shown for ease of understanding and description, and the present invention does not limit the size and thickness of each component.

When a component is described as "on" another component, the components are formed in direct contact, and may also include embodiments in which additional features may be formed interposing the first and second features, such that the first and second features may not be in direct contact. When a component is described as "installed to" or "connected to" another component, it can be understood that a component is "directly installed" or "directly connected" to another component, or a component is "installed to" or "connected with" another component through an intermediate component.

Embodiment 1

As shown in FIG. 1, this embodiment provides a display device 100 including a display screen 1, a polarizer 2, a cover plate 3, and a first glass 4.

Figure 2:
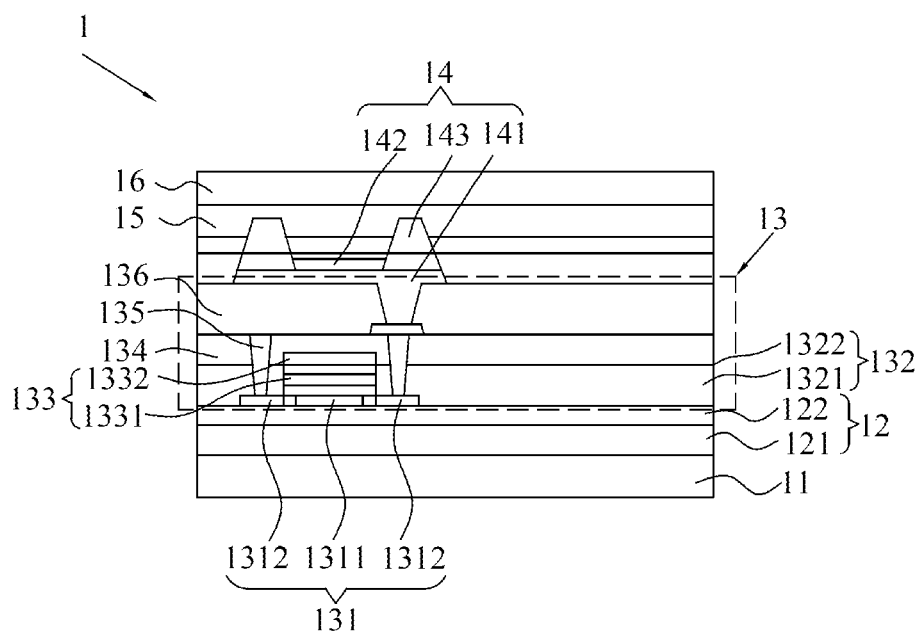
FIG. 2 is a schematic structural diagram of a display screen.

As shown in FIGS. 1 and 2, the display screen 1 includes a second glass 11, a buffer layer 12, a thin film transistor layer 13, a light-emitting layer 14, a encapsulation layer 15, and a touch sensor layer 16.

The material of the second glass 11 includes at least one of inorganic minerals, $Na_2SiO_3$, $CaSiO_3$, $SiO_2$, and $Na_2O \cdot CaO \cdot 6SiO_2$. The thickness of the second glass 11 is less than 100 µm. The high yield strength characteristics and rigidity of the second glass are used to improve the flatness of the display device 100 and the water and oxygen blocking performance of the display device 100.

The buffer layer 12 is disposed on the second glass 11; the buffer layer 12 includes a first buffer layer 121 and a second buffer layer 122 which are sequentially disposed on the second glass 11. The buffer layer 12 mainly functions as a buffer and a protection.

The active layer 131 is disposed on the buffer layer 2. The active layer 131 includes a main body portion 1311 and two side portions 1312. Specifically, in this embodiment, the polysiliconization of the active layer 131 is mainly realized by using an excimer laser crystallization technology, and then the active layer 131 is patterned through a PR mask to form the main body portion 1311 and the two side portions 1312. Finally, an ion doping process is performed on the two side portions 1312 of the active layer 131 through the PR mask to form a P-type semiconductor.

The insulating layer 132 is disposed on the active layer 131, and the gate layer 133 is disposed on the insulating layer 132. Specifically, the insulating layer 132 includes a first insulating layer 1321 and a second insulating layer 1322; the gate layer 133 includes a first gate layer 1331 and a second gate layer 1332; the first insulating layer 1321 is disposed on the active layer 131; the first gate layer 1331 is disposed on the first insulating layer 1321; the second insulating layer 1322 is disposed on the first gate layer 1331; and the first second gate layer 1332 is disposed on the second insulating layer 1322.

The insulating layer 132 mainly plays an insulating role, and the first insulating layer 1321 mainly prevents a short circuit phenomenon caused by the contact between the first gate layer 1331 and the active layer 131. The material of the insulating layer 132 includes one or more of SiO2 and SiNx.

The material of the gate layer 33 includes a metal, such as copper or molybdenum.

The interlayer insulating layer 134 is disposed on the second gate layer 1322, and mainly used to prevent the source/drain layer 135 disposed thereon from contacting with the second gate layer 1322 to generate a short circuit phenomenon. The material of the interlayer insulating layer 134 includes one or more of SiO2 and SiNx.

The source/drain layer 135 is disposed on the interlayer insulating layer 134 and is connected to the active layer 131 through a via hole. Thereby, the source/drain layer 135 can be electrically connected to the active layer 131.

The planarization layer 136 is disposed on the source/drain layer 135, and mainly plays a role of flattening, to provide a smooth surface for the preparation of the subsequent layers.

The light-emitting layer 14 is disposed on the thin film transistor layer 13. The light-emitting layer 14 includes an anode layer 141, an organic light-emitting layer 142, and a cathode layer 143.

The anode layer 141 is disposed on the planarization layer 136 and is connected to the source/drain layer 135 through a via hole. The organic light-emitting layer 142 is disposed on the anode layer 142, and the cathode layer is disposed on the organic light-emitting layer 143.

The encapsulation layer 15 is disposed on the light-emitting layer 14. The encapsulation layer 15 is mainly used to prevent water and oxygen from invading and causing damage to the component in the display screen.

The touch sensor layer 16 is disposed on the encapsulation layer 15.

The display device 100 further includes an optical adhesive 5 disposed between the display screen 1 and the polarizer 2. The optical adhesive includes a first optical adhesive 51 and a second optical adhesive 52.

The polarizer 2 is disposed on the display screen 1. The polarizer 2 includes a first liquid crystal layer 21, a ¼ wavelength plate 22, an interlayer 23, and a second liquid crystal layer 24.

The first liquid crystal layer 21 is disposed on the display screen 1 and mainly plays a role of converting natural light into polarized light.

The ¼ wavelength plate 22 is disposed on the first liquid crystal layer 21 and mainly converts linearly polarized light into circularly polarized light.

The interlayer 23 is disposed on the ¼ wavelength plate 22 to prevent mutual dissolution reaction between an upper layer and a lower layer.

The second liquid crystal layer 24 is disposed on the interlayer 23, and mainly plays a role of improving chromatic aberration at a large viewing angle.

The cover plate 3 is disposed on the polarizer 2. The cover plate 3 includes an explosion-proof film 31, a hard coat layer 32, and a protective film 33.

The explosion-proof film 31 is disposed on the first glass 4; the hard coat layer 32 is disposed on the explosion-proof film 31; and the protective film 33 is disposed on the hard coat layer 32.

The first glass 4 is disposed between the polarizer 2 and the cover plate 3. The material of the first glass 4 includes at least one of inorganic minerals, $Na_2SiO_3$, $CaSiO_3$, $SiO_2$, and $Na_2O \cdot CaO \cdot 6SiO_2$. The thickness of the first glass 4 is less than 100 μm. By using the high yield strength characteristics and rigidity of the first glass 4, the flatness of the display device 100 is improved, and the water and oxygen blocking performance of the display device 100 is elevated.

Embodiment 2

Figure 3:
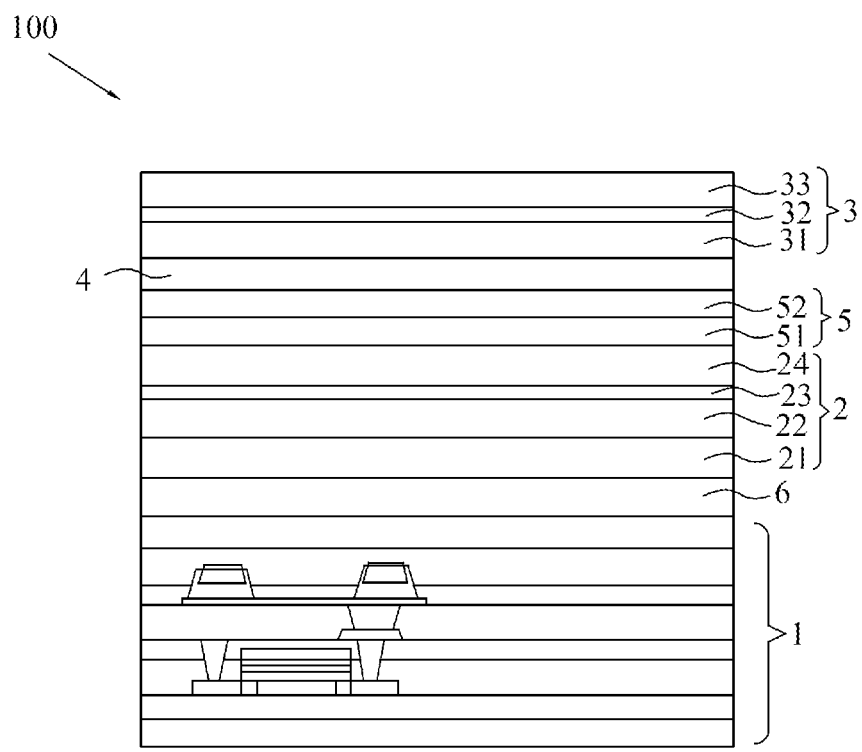
FIG. 3 is a schematic structural diagram of a display device according to the Embodiment 2.

As shown in FIG. 3, this embodiment includes most of the technical features of Embodiment 1. The difference between this embodiment and Embodiment 1 is that in this embodiment, the optical adhesive 5 is disposed between the polarizer 2 and the cover 3, instead of being disposed between the display screen 1 and the polarizer 3 in Embodiment 1.

The display device 100 of this embodiment further includes a protective layer 6 disposed between the display screen 1 and the polarizer 2. This can protect the touch sensor layer 16 from being invaded by water and oxygen, and prevent the touch sensor layer 16 from being damaged by stress.

In this embodiment, the high yield strength characteristics and rigidity of the first glass 4 are used to improve the flatness of the display device 100 and the water and oxygen blocking performance of the display device 100. The high yield strength characteristics and rigidity of the second glass 11 are used to improve the flatness of the display device 100 and the water and oxygen blocking performance of the display device 100.

Embodiment 3

This embodiment provides a method of manufacturing the display device described in Embodiment 1.

Figure 4:
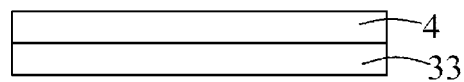
FIG. 4 is a schematic structural diagram of a first glass and a protective film.

As shown in FIG. 4, the method of manufacturing the display device includes: providing a protective film 33, and preparing a first glass 4 on the protective film 33.

Figure 5:
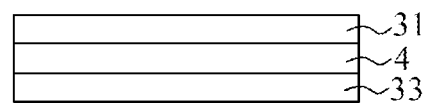
FIG. 5 is a schematic structural diagram of a protective film, a first glass, and an explosion-proof film.

As shown in FIG. 5, an explosion-proof film 31 is coated on a surface of the first glass 4.

Figure 6:
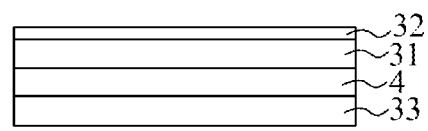
FIG. 6 is a schematic structural diagram of a protective film, a first glass, an explosion-proof film, and a hard coat layer.

As shown in FIG. 6, a hard coat layer 32 is prepared on a surface of the explosion-proof film 31 away from the first glass 4.

Figure 7:
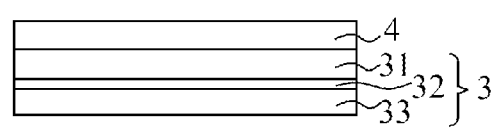
FIG. 7 is a schematic structural diagram of a first glass and a cover plate.

As shown in FIG. 7, the layer on a side of the first glass 4 away from the protective film 33 is entirely flipped over to form a cover plate 3 disposed on the first glass 4.

Figure 8:
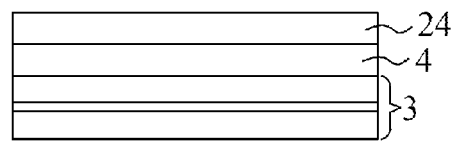
FIG. 8 is a schematic structural diagram of a cover plate, a first glass, and a second liquid crystal layer.

As shown in FIG. 8, a second liquid crystal layer 24 is prepared on a surface of the first glass 4 away from the cover plate.

Figure 9:
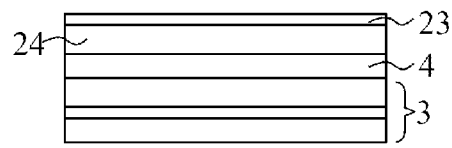
FIG. 9 is a schematic structural diagram of a cover plate, a first glass, a second liquid crystal layer, and an interlayer.

As shown in FIG. 9, an interlayer 23 is prepared on a surface of the second liquid crystal layer 24 away from the first glass.

Figure 10:
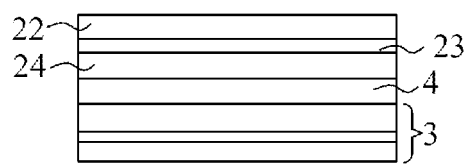
FIG. 10 is a schematic structural diagram of a cover plate, a first glass, a second liquid crystal layer, an interlayer, and a ¼ wavelength plate.

As shown in FIG. 10, a ¼ wavelength plate 22 is prepared on a surface of the interlayer away from the first glass.

Figure 11:
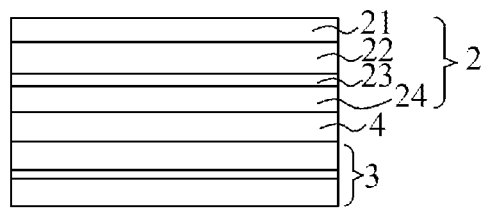
FIG. 11 is a schematic structural diagram of a cover plate, a first glass, and a polarizer.

As shown in FIG. 11, a first liquid crystal layer 21 is prepared on a surface of the ¼ wavelength plate 22 away from the first glass to form a polarizer 2.

A display screen 1 is prepared on a glass substrate, a first optical adhesive 51 is coated on a surface of the prepared display screen 1 away from the second glass 11, and a second liquid crystal layer 52 is coated on a surface of the prepared display screen 1 away from the first glass 4. After that, the first optical adhesive 51 is bonded to the second optical adhesive 52, and then the display screen 1 is peeled from the glass substrate by a laser lift-off technology, thereby forming a display device 100.

Embodiment 4

This embodiment provides a method of manufacturing the display device described in Embodiment 2.

As shown in FIG. 4, the method of manufacturing the display device includes: providing a protective film 33, and preparing a first glass 4 on the protective film 33.

As shown in FIG. 5, an explosion-proof film 31 is coated on a surface of the first glass 4.

As shown in FIG. 6, a hard coat layer 32 is prepared on a surface of the explosion-proof film 31 away from the first glass 4.

As shown in FIG. 7, the layer on the side of the first glass 4 away from the protective film 33 is entirely flipped over to form a cover plate 3 disposed on the first glass 4.

A display screen 1 is prepared on a glass substrate, and a protective layer 6, a first liquid crystal layer 21, a ¼ wavelength plate 22, an interlayer 23, and a second liquid crystal layer 24 are sequentially prepared on a surface of the prepared display screen 1 away from the second glass 11 sequentially.

A first optical adhesive 51 is coated on a surface of the second liquid crystal layer 24 away from the display screen 1, and a second optical adhesive 52 is coated on a surface of the first glass 4 away from the cover plate 3. After that, the first optical adhesive 51 is bonded to the second optical adhesive 52, and then the display screen 1 is peeled from the glass substrate by a laser lift-off technology, thereby forming a display device 100.

The display device provided in the embodiments of the present application have been described in detail above. Specific examples are used in this document to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

What is claimed is:

1. A display device, comprising:
    a display screen comprising a second glass, a thin film transistor layer, a light-emitting layer and a touch sensor layer; and
    a polarizer, a first glass and a cover plate sequentially disposed on the display screen;
    wherein the first glass and the second glass are not in contact with each other and the first glass is disposed external to the display screen.

2. The display device according to claim 1, wherein the display screen further comprises:
    a buffer layer disposed on the second glass; and
    an encapsulation layer disposed on the light-emitting layer;
    wherein the thin film transistor layer is disposed on the buffer layer;
    the light-emitting layer is disposed on the thin film transistor layer; and
    the touch sensor layer is disposed on the encapsulation layer.

3. The display device according to claim 1, wherein the polarizer comprises:
    a first liquid crystal layer disposed on the display screen;
    a ¼ wavelength plate disposed on the first liquid crystal layer;
    an interlayer disposed on the ¼ wavelength plate; and
    a second liquid crystal layer disposed on the interlayer.

4. The display device according to claim 1, wherein the cover plate comprises:
    an explosion-proof film disposed on the first glass;
    a hard coat layer disposed on the explosion-proof film; and
    a protective film disposed on the hard coat layer.

5. The display device according to claim 1, further comprising:
    an optical adhesive disposed between the display screen and the polarizer.

6. The display device according to claim 1, further comprising:
    an optical adhesive disposed between the polarizer and the cover plate.

7. The display device according to claim 6, further comprising:
    a protective layer disposed between the display screen and the polarizer.

8. The display device according to claim 1, wherein the first glass is made of a material comprising at least one of inorganic minerals, $Na_2SiO_3$, $CaSiO_3$, $SiO_2$, or $Na_2O \cdot CaO \cdot 6SiO_2$.

9. The display device according to claim 2, wherein the second glass is made of a material comprising at least one of inorganic minerals, $Na_2SiO_3$, $CaSiO_3$, $SiO_2$, or $Na_2O \cdot CaO \cdot 6SiO_2$.

10. The display device according to claim 2, wherein each of the first glass and the second glass has a thickness less than 100 μm.

* * * * *